United States Patent [19]

Sundaresan

[11] Patent Number: 5,721,163

[45] Date of Patent: Feb. 24, 1998

[54] METHOD OF MANUFACTURE OF THIN FILM TRANSISTOR SRAM DEVICE WITH A TITANIUM NITRIDE OR SILICIDE GATE

[75] Inventor: Ravishankar Sundaresan, Plano, Tex.

[73] Assignee: Chartered Semiconductor Manufacturing Pte, Ltd., Singapore, Singapore

[21] Appl. No.: 661,252

[22] Filed: Jun. 10, 1996

[51] Int. Cl.[6] .............................................. H01L 21/8244
[52] U.S. Cl. ........................ 438/153; 438/158; 438/159
[58] Field of Search ............................. 437/21, 40 TFI,
437/40 GS, 41 TFI, 41 GS, 45, 52, 57,
59, 192, 200; 438/152, 153, 158, 159, 291

[56] References Cited

U.S. PATENT DOCUMENTS

| | | | |
|---|---|---|---|
| 4,654,121 | 3/1987 | Miller et al. | 438/158 |
| 4,931,411 | 6/1990 | Tigelaar et al. | 437/192 |
| 4,980,732 | 12/1990 | Okazawa | 357/235 |
| 5,151,374 | 9/1992 | Wu | 437/40 |
| 5,187,114 | 2/1993 | Chan et al. | 437/52 |
| 5,252,502 | 10/1993 | Havemann | 437/41 |
| 5,275,964 | 1/1994 | Hayden | 438/158 |
| 5,327,003 | 7/1994 | Itabashi et al. | 257/385 |
| 5,385,854 | 1/1995 | Batra et al. | 438/158 |
| 5,397,718 | 3/1995 | Furuta et al. | 438/158 |
| 5,495,119 | 2/1996 | Ikeuchi | 257/365 |
| 5,600,153 | 2/1997 | Manning | 257/66 |

FOREIGN PATENT DOCUMENTS

| | | |
|---|---|---|
| 63-140580 | 6/1988 | Japan . |
| 2-132832 | 5/1990 | Japan . |
| 4-3469 | 1/1992 | Japan . |
| 4-152566 | 5/1992 | Japan . |
| 5-102433 | 4/1993 | Japan . |
| 5-315571 | 11/1993 | Japan . |

OTHER PUBLICATIONS

N. Okazaki et al., IEEE J. Solid State Circuits, 19(5)(1984)552 "A 16 ns 2K ×8 Bit Full CMOS SRAM" Oct. 1984.

J.-M. Hwang et al., IEDM Proc. '92, p. 345, "Novel polysilicon/TiN stacked-gate . . SOI/CMOS" 1992.

M. Wittmer et al., Thin Solid Films 93(1982)397 "Applications of TiN thin films . . . " 1982.

S. Wolf, "Silicon Processing for the VLSI Era", vol. II, pp. 321–322, 1990.

*Primary Examiner*—Charles L. Bowers, Jr.
*Assistant Examiner*—Leon Radomsky
*Attorney, Agent, or Firm*—George O. Saile; Stephen B. Ackerman; Graham S. Jones, II

[57] ABSTRACT

A semiconductor device comprises a semiconductor substrate of a first conductivity type with a first insulating layer formed on the semiconductor substrate and a thin film field effect transistor with a control gate containing a refractory metal silicide formed on the semiconductor substrate over the first insulating layer. A second insulating layer covers the control gate electrode. A semiconductor film is formed on the semiconductor substrate over the first and second insulating layers and having a first region of a second conductivity type opposite to the first conductivity type. A second region of the first conductivity type is formed in contact with a first end of the first region. A third region of the first conductivity type is formed in contact with a second end of the first region. The control gate electrode and a part of the first region are overlapped with each other over the second insulating layer. The second end of the first region is apart from the second side surface of the control gate electrode by a distance more than a thickness of a part of the second insulating layer covering a side surface of the control gate electrode and does not overlap with the control gate electrode, wherein the second and third regions serve as a source and a drain of the thin film field effect transistor, respectively.

11 Claims, 3 Drawing Sheets

METHOD OF MANUFACTURE OF THIN FILM TRANSISTOR SRAM DEVICE WITH A TITANIUM NITRIDE OR SILICIDE GATE

BACKGROUND OF THE INVENTION

1. Field of the Invention

This invention relates to semiconductor devices and more particularly to a static random access memory semiconductor devices.

2. Description of Related Art

In VLSI semiconductor circuits memories are formed of semiconductor devices, which store data by means of electric charges. Different types of such memories include Static Random Access Memories (SRAM's), Dynamic Random Access Memories (DRAM's), Read Only Memories (ROMs), etc. These semiconductor memory devices can be packed in very large numbers of memory cells with a large storage capacity in a space with very low volume and can be manufactured at a low cost. Among these memories, the static type semiconductor memory has been widely used as a random access memory (RAM), because it can retain stored data without periodically being refreshed during operation.

The static random access memory (SRAM) can be implemented by a large number of bistable flip-flop circuits each of which stores one bit of information. The CMOS flip-flop circuit is composed of a pair of N-channel MOS field effect transistors and a pair of P-channel MOS Field effect transistors used as a memory cell because of the very low power consumption of the CMOS flip-flop circuit. However, the CMOS flip-flop circuit generally requires a relatively large surface area on a semiconductor substrate, so in the past, there has been a limitation to the capacity of an SRAM by employing the CMOS flip-flop.

Several years ago, a design was adopted in which the cell includes a partial substitution of thin film transistors (TFTs) for the buried FET devices of a pair of P-channel MOS transistors of the CMOS flip-flop circuit in a Silicon-On-Insulator (SOI) structure. According to the TFT or SOI technique, the N channel MOS transistors are formed at a surface of a semiconductor substrate and the P-channel MOS transistors have been fabricated by a polycrystalline silicon layer or a monocrystalline silicon layer which is formed on the surface of the semiconductor substrate over an insulating layer. According to this technique, the P-channel transistors can overlap a part of the N-channel MOS transistors, and therefore the space required by each cell of an SRAM is reduced.

A problem with the above approach is that typical polysilicon TFTs suffer from a high negative threshold voltage.

SUMMARY OF THE INVENTION

One choice for solving the problem of high negative threshold voltage is to use a material whose Fermi level is situated near the intrinsic level, which results in a 0.55 Volt reduction in Vt, thereby reducing the high negative voltage.

Thus the novelty of the invention is the use as a control gate electrode material of a material having a threshold level near the intrinsic level such as TiN or refractory metal silicides.

In accordance with this invention, a method is provided for forming a thin film field effect transistor on a semiconductor substrate of a first conductivity type including the steps as follows:

1) form conventional N+ and P+ source/drain regions of a field effect transistor in the substrate, a gate oxide layer over the substrate and a control gate electrode over the substrate to form FET devices.

2) deposit an interconductor dielectric layer over the FET devices, 3) form a buried contact via opening through the interconductor dielectric layer to a drain region, 4) deposit a TiN/Refractory metal silicide gate layer to form a buried contact in the via opening, 5) form a mask over the gate layer and pattern the gate layer by etching of control gate electrode to form a control gate, 6) form a thin film transistor gate oxide layer covering the exposed surfaces of the control gate electrode, 7) deposit a semiconductor polysilicon thin film which is undoped for a thin film transistor active channel over the gate oxide layer.

8) performing a Vt implant adjustment of the device by doping with P-type or N-type boron/phosphorus dopant in a dose of from about $10^{16}$ atoms/cm3 to about $10^{17}$ atoms/cm3, and 9) form thin film transistor source/drain regions by ion implantation in the semiconductor polysilicon thin film. Then form a TFT polysilicon mask for patterning the polysilicon thin film and etch to remove unwanted portions of the thin film.

10) Perform standard back end flow through second metal.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
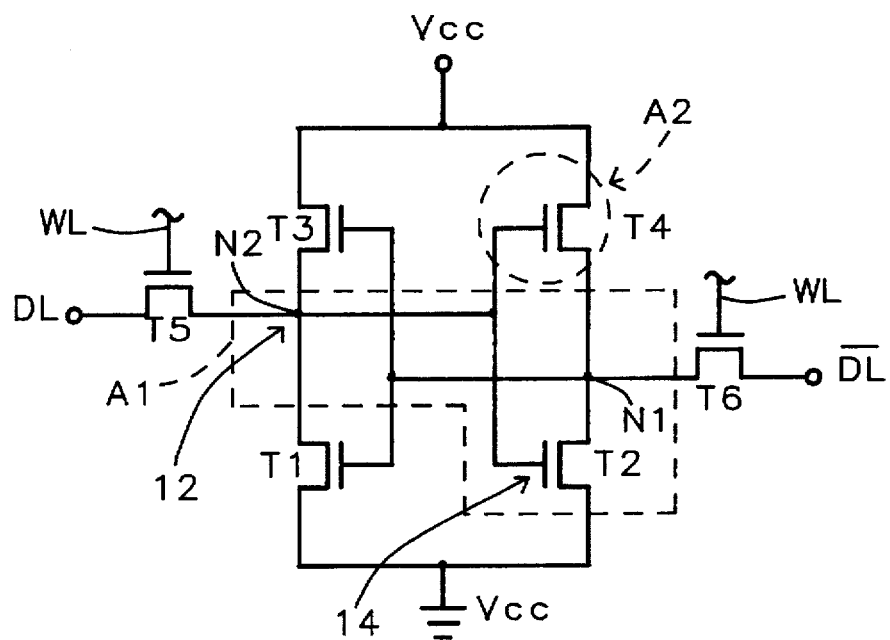
FIG. 1 shows an electrical schematic diagram of a CMOS type Static Random Access Memory (SRAM).

FIG. 1 shows an electrical schematic diagram of a CMOS type Static Random Access Memory (SRAM). In FIG. 1, N-channel MOS pass transistors T1 and T2 and P-channel MOS drive transistors T3 and T4 form a CMOS flip-flop circuit in which the transistors T3 and T1 have control gate electrodes electrically connected to node N1 to form a first CMOS inverter and the transistors T4 and T2 have control gate electrodes electrically connected to node N2 forming a second CMOS inverter. Nodes N1 and N2 of the first and second CMOS inverters are connected to a pair of digit lines DL and DL(bar) via a pair of N-channel transfer gate transistors T5 and T6 having their control gate electrodes controlled by a word line WL respectively.

Polysilicon thin film transistors (TFTs) typically have high Vt due to grain boundaries. This makes polysilicon TFTs unsuitable for a 3.3 V SRAM application. TFTs will not be suitable unless the Vt can be lowered, but polysilicon has the opposite effect.

In addition, typically P+ polysilicon, which is used conventionally to form the control gate electrodes adds an extra interlayer and cannot be used as an interconnect.

In accordance with this invention the control gate electrode of the TFT is composed (instead of doped polysilicon)

of a material selected from the group consisting of titanium nitride (TIN) and a refractory metal silicide selected from the group consisting of tungsten, titanium, molybdenum, and tantalum. These refractory metal silicides have Fermi levels near the intrinsic level.

The use of titanium nitride or a refractory metal silicide for the control lowers the Vt of the control gate electrode of the P-channel TFT devices, since the flat band of titanium nitride and the refractory metal silicides is near midgap.

Figure 2:
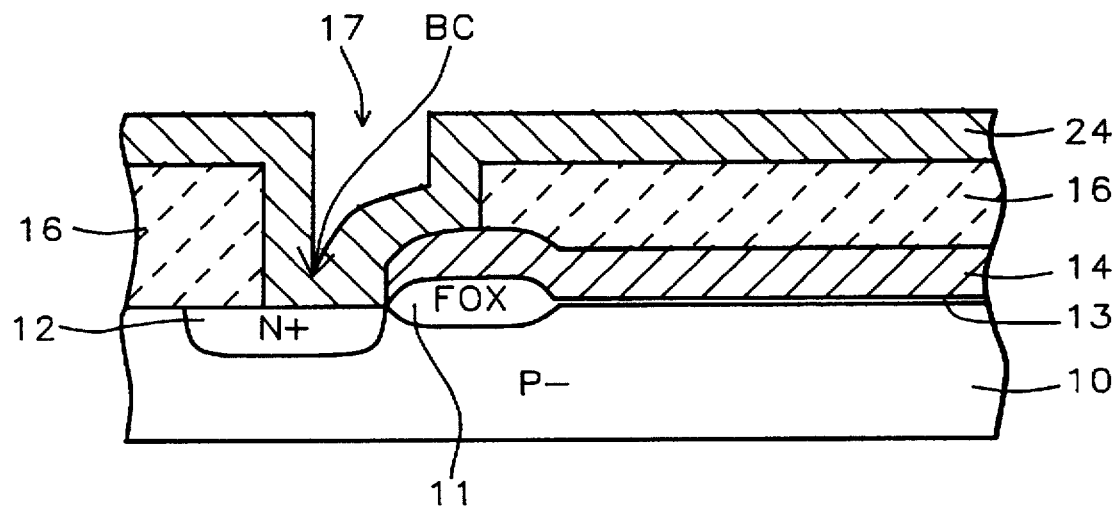
FIG. 2 shows a partial sectional view of a semiconductor embodiment of the SRAM device of FIG. 1 focussing upon an area A1 in FIG. 1 marked by dotted lines.

FIG. 2 shows a partial sectional view of a semiconductor embodiment of the SRAM device of FIG. 1 focussing upon an area A1 in FIG. 1 marked by dotted lines.

In general, FIG. 2 shows a P− doped silicon semiconductor substrate 10 which has a FOX region 11 formed therein with the remainder covered with conventional gate oxide layer 13 with an N+ S/D region 12 located at the junction between the source of drive transistors T3 and the drain of pass transistor T1. Above the FOX region and to the right thereof is a polysilicon layer 14. A silicon dioxide layer 16 covers the polysilicon layer 14 and the left portion of the region 12 as well as the left portion of substrate 10. The titanium nitride layer 24 covers the interpolysilicon oxide, (silicon dioxide, interconductor dielectric) layer 16 and extends down through layer 16 through a contact hole 17 to form a buried electrical and mechanical contact BC to the upper surface of the N+ S/D region 12.

The area A1 includes the interconnection lines of node N2 connection, as well as, the gate electrode of pass transistor T2 from transistor T5. The process which produces the device as seen in FIG. 2 includes steps of note as follows:

Step 1. Complete the conventional CMOS SRAM process to make the conventional substrate transistors T1 and T2.

Step 2. Make a buried contact opening 17 for the buried contact BC.

Step 3. Deposit the titanium nitride or refractory metal silicide to form a buried contact to connect layer 24 to the N+ drain 12 and to form the gate electrode of pass transistor T2.

FIGS. 3A–3E shows a section of an area A2 in FIG. 1 about the TFT drive transistor T4.

Figure 3A:
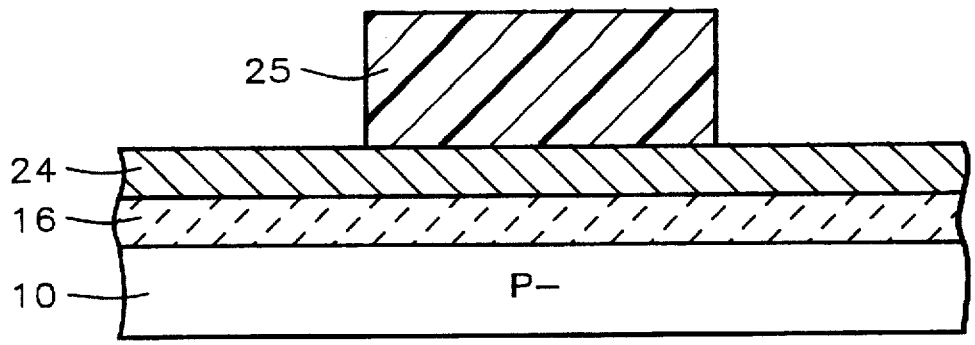
FIGS. 3A–3E shows a section of an area A2 in FIG. 1 about the TFT drive transistor T4.

FIG. 3A shows a P− doped silicon semiconductor substrate 10 with the InterPolysilicon Oxide (IPO) dielectric layer 16 formed thereon with a thickness of between about 500 Å and about 1,000 Å and a TiN or refractory metal silicide gate electrode 24 formed thereon by a conventional method with an optimum thickness of about 500 Å with a range of possible thicknesses between about 500 Å and about 1,000 Å.

InterPolysilicon Oxide (IPO) dielectric layer 16 comprises a silicon dioxide layer.

FIG. 3A also shows gate electrode layer 24 covered in part by a photoresist mask 25 for patterning by etching of control gate electrode from layer 24 in FIG. 3A.

Figure 3B:
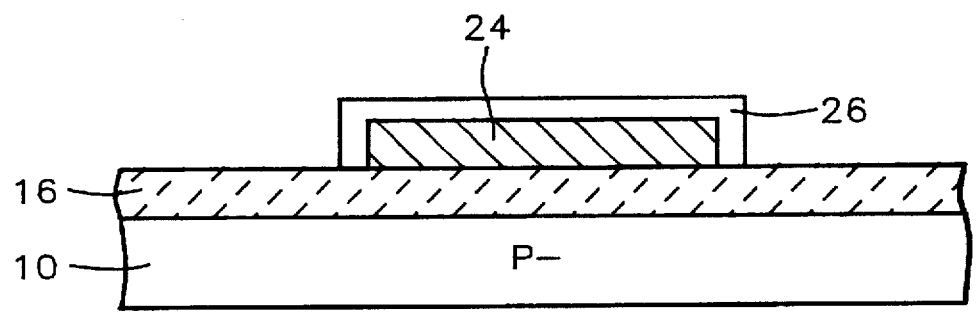

FIG. 3B shows the product of FIG. 3A after etching of layer 24 in FIG. 3A to form the control gate electrode 24. Next, there is formed a TFT (silicon dioxide) gate oxide, dielectric layer 26 covering exposed surfaces of control gate electrode 24 down to the newly exposed surface of IPO dielectric layer 16 so that the gate electrode 24 is encapsulated by dielectric material in the form of the gate oxide layer 26 and IPO layer 16.

Figure 3C:
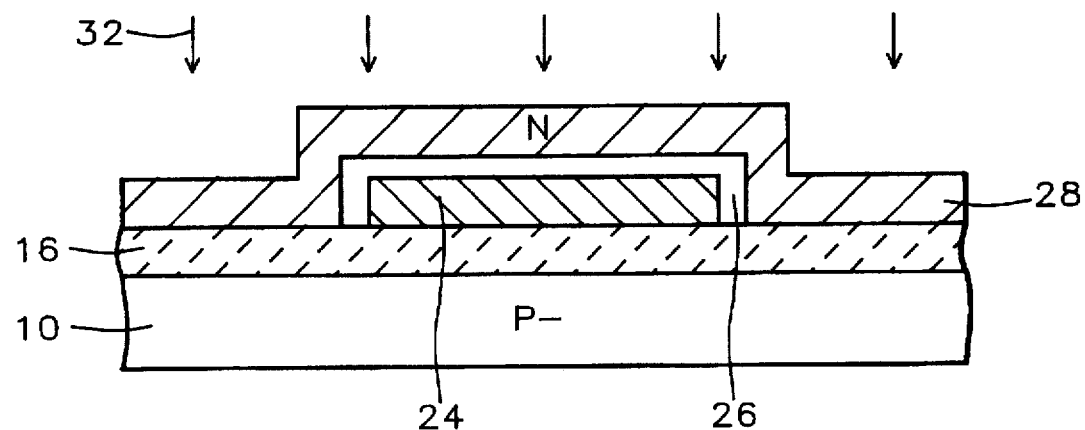

FIG. 3C shows the product of FIG. 3B after deposition of undoped polysilicon thin film 28 for a TFT active channel over gate dielectric layer 26 with a thickness of between about 300 Å and about 800 Å.

Next a Vt implant adjustment with a P-type or N-type adjustment of the polysilicon thin film 28 with dopant ions 32 in a dose of boron or phosphorus from about $10^{16}$ atoms/cm3 to about $10^{17}$ atoms/cm3.

| Values of Vt (Volts) | | |
|---|---|---|
| Normal Vt | about −3.0 V to −5.0 V | (N+ polysilicon) |
| Alternative 1 Vt | about −2.0 V to −4.0 V | (P+ polysilicon) |
| Alternative 2 Vt | about −2.5 V to −4.5 V | (TiN or Refractory Metal Silicide) |

Figure 3D:
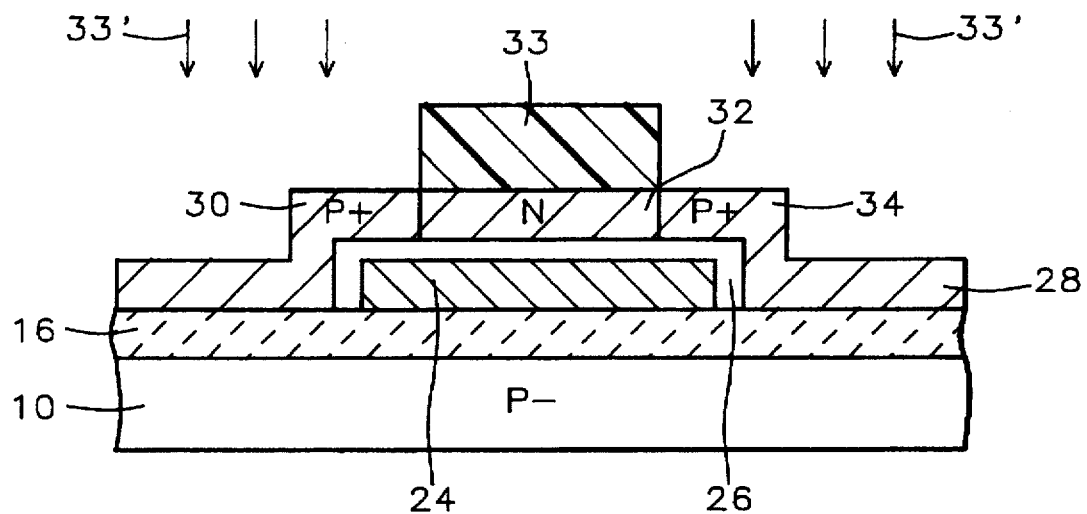
Figure 3E:
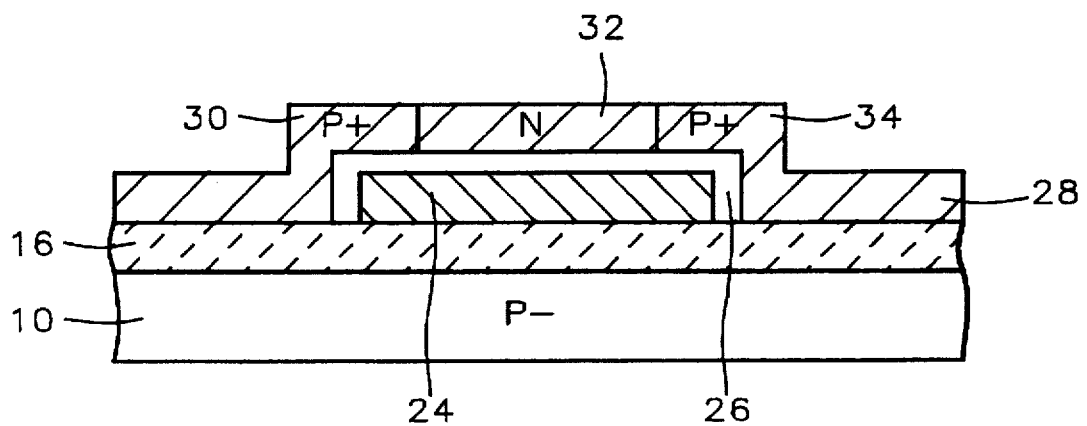

FIG. 3D shows the product of FIG. 3C after formation of photoresist mask 33 over the electrode 24 to protect the channel region 32 in polysilicon thin film 28 from doping with P+ dopant 33'. In FIG. 3D, the dopant 33' is being ion implanted into TFT S/D regions 30 and 34 of polysilicon thin film 28 with boron $B^{11}$ dopant ions 32 in a dose of from about $10^{19}$ atoms/cm3 to about $10^{20}$ atoms/cm3 to form the source/drain regions 30/34 of the TFT device as shown in FIG. 3E with the mask 33 removed.

Additional trivial processing includes application of a TFT pattern mask for patterning the thin film 28 and etching thereof to form the pattern of the transistor. Next follows standard steps, such as BPSG, planarization, contact opening and metallization (single or double level depending upon design) end flow to complete the process.

Process Flow

A process flow sequence for the subject invention is as follows:

1. Follow the standard SRAM process flow through N+ and P+ source/drain regions 12 for an FET, and formation of a first polysilicon layer from which FET control gates for the original FET devices with the source/drain regions 12 in the substrate 10.

2. Deposit a interpolysilicon oxide layer 16 in FIGS. 2 and 3A.

3. Form a buried contact opening 17 in FIG. 2.

4. Deposit a the TiN/Refractory metal silicide gate layer 24 forming buried contact BC in opening 17 in FIG. 2 and FIG. 3A.

5. Form a photoresist mask 25 and pattern by etching of control gate electrode from layer 24 in FIG. 3A.

6. Form a TFT (silicon dioxide) gate oxide, dielectric layer 26 covering exposed surfaces of control gate electrode 24 in FIG. 3B.

7. Deposit a polysilicon thin film 28 for TFT active channel over gate dielectric layer 26 in FIG. 3C which is undoped.

8. Vt implant adjustment with P-type or N-type boron/phosphorus dopant with dopant ions 32 in a dose of from about about $10^{16}$ atoms/cm3 to about $10^{17}$ atoms/cm3.

9. Form TFT S/D regions by ion implantation. Form a TFT polysilicon mask for patterning the polysilicon thin film 28 and etch to remove unwanted portions of thin film 28.

10. Standard back end flow through second metal.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a device including a thin film field effect transistor and a buried contact on a doped silicon semiconductor substrate of a first conductivity type;

forming source/drain regions of a field effect transistor in said substrate, forming a first insulating layer over said semiconductor substrate;

forming a buried contact via opening through said first insulating layer to expose said source/drain region in said doped silicon semiconductor substrate, forming a conductor layer providing a combined buried contact and gate electrode for a thin film field effect transistor on said first insulating layer composed of a material selected from the group consisting of titanium nitride and a refractory metal silicide over said first insulating layer, forming a second insulating layer covering an upper surface and first and second side surfaces of said gate electrode, and forming a polycrystalline silicon film on said semiconductor substrate over said first and second insulating layers, performing a threshold implanting step doping said polysilicon film with dopant of a second conductivity type opposite from said first conductivity type, forming a mask above said gate electrode over a first region of said semiconductor film, performing ion implanting of dopant of said first conductivity type into said semiconductor film aside from said mask to form a second region of said semiconductor film of said first conductivity type formed in contact with a first end of said first region, and a third region of said semiconductor film of said first conductivity type and formed in contact with a second end of said first region, said gate electrode and a part of said first region being overlapped with each other over said second insulating layer, said first region forming the channel of a thin film transistor and the width of said first region being shorter than the width of said gate electrode, wherein said second region and said third region serve as a source and a drain of said thin film field effect transistor, respectively.

2. A method of forming a semiconductor device according to claim 1, in which said first conductivity type is a P type and said second conductivity type is an N type.

3. A method of forming a semiconductor device according to claim 1, in which said first conductivity type is a P type and said second conductivity type is an N type, said polycrystalline silicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3 said second and third regions are doped with $B^{11}$ dopant with dopant ions of from about $10^{19}$ atoms/cm3 to about $10^{20}$ atoms/cm3.

4. A method of forming a semiconductor device according to claim 1 wherein:

said polycrystalline silicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said second and third regions are doped with $B^{11}$ dopant with dopant ions of from about $10^{19}$ atoms/cm3 to about $10^{20}$ atoms/cm3.

5. A method of forming a semiconductor device according to claim 1 wherein:

said first insulating layer has a thickness from about 500 Å to about 1,000 Å, said conductor layer has a thickness from about 500 Å to about 1,000 Å, said polycrystalline silicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said second and third regions are doped with $B^{11}$ dopant with dopant ions of from about $10^{19}$ atoms/cm3 to about $10^{20}$ atoms/cm3.

6. A method of forming an SRAM device including a thin film field effect transistor and a buried contact on a doped silicon semiconductor substrate of a first conductivity type;

forming conventional N+ and P+ source/drain regions of a field effect transistor in said substrate, a gate oxide layer over said substrate and a gate electrode over said substrate to form FET devices, deposition of an interconductor dielectric layer over said FET devices, forming a buried contact via opening through said interconductor dielectric layer to said drain region in said doped silicon semiconductor substrate, depositing a refractory metal silicide gate electrode layer to form a buried contact in said via opening to said drain region and for forming a gate electrode for another field effect transistor , formation of mask over said gate layer and patterning said gate layer by etching of said gate electrode layer to form a gate electrode with exposed surfaces, forming a thin film transistor gate oxide layer covering said exposed surfaces of said gate electrode layer, depositing an undoped semiconductor polysilicon thin film for a thin film transistor active channel over said gate oxide layer, performing a Vt implant adjustment of said polysilicon thin film by implanting therein a dopant selected from the group consisting of boron and phosphorus dopant with dopant ions in a dose of from about $10^{16}$ atoms/cm3 to about $10^{17}$ atoms/cm3, and forming thin film transistor source/drain regions in said polysilicon thin film.

7. A method of forming a semiconductor device according to claim 6 wherein:

said polysilicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said source/drain regions are doped with $B^{11}$ dopant with dopant ions of from about $10^{19}$ atoms/cm3 to about $10^{20}$ atoms/cm3.

8. A method of forming a semiconductor device according to claim 6 wherein:

said interconductor dielectric layer has a thickness from about 500 Å to about 1,000 Å, said conductor layer has a thickness from about 500 Å to about 1,000 Å, said polysilicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said source/drain regions are doped with $B^{11}$ dopant with dopant ions of from about $10^{19}$ atoms/cm3 to about $10^{20}$ atoms/cm3.

9. A method of forming an SRAM device including a thin film field effect transistor and a buried contact on a doped silicon semiconductor substrate of a first conductivity type;

forming conventional N+ and P+ source/drain regions of a field effect transistor in said substrate, a gate oxide layer over said substrate and a gate electrode over said substrate to form FET devices, deposition of an interconductor dielectric layer over said FET devices, forming a buried contact via opening through said interconductor dielectric layer to said drain region in said doped silicon semiconductor substrate, depositing a TiN gate electrode layer to form a buried contact in said via opening to said drain region, formation of mask over said gate electrode layer and patterning said gate layer by etching of a gate electrode to form a gate electrode with exposed surfaces, forming a thin film transistor gate oxide layer covering said exposed surfaces of said gate electrode, depositing an undoped semiconductor polysilicon thin film for a thin film transistor active channel over said gate oxide layer, performing a Vt implant adjustment of said polysilicon thin film by implanting therein a dopant selected from the group consisting of boron and phosphorus dopant with dopant ions in a dose of from about $10^{16}$ atoms/cm3 to about $10^{17}$ atoms/cm3, and forming thin film transistor source/drain regions in said polysilicon thin film.

10. A method of forming a semiconductor device according to claim 9 wherein:

said polysilicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said source/drain regions are doped with $B^{11}$ dopant with dopant ions of from about $10^{19}$ atoms/cm3 to about $10^{20}$ atoms/cm3.

11. A method of forming a semiconductor device according to claim 9 wherein:

said interconductor dielectric layer has a thickness from about 500 Å to about 1,000 Å, said conductor layer has a thickness from about 500 Å to about 1,000 Å, said polysilicon film has a thickness from about 300 Å to about 800 Å and said film is doped by said dopant which is selected from the group consisting of boron and said threshold implant step provides a phosphorus dopant with dopant ions of from about $10^{16}$ atoms/cm3 to about $10^{17}$ atoms/cm3, and said source/drain regions are doped with $B^{11}$ dopant with dopant ions of from about $10^{19}$ atoms/cm3 to about $10^{20}$ atoms/cm3.

\* \* \* \* \*